United States Patent [19]

Iwamatsu

[11] 3,919,008

[45] Nov. 11, 1975

[54] METHOD OF MANUFACTURING MOS TYPE SEMICONDUCTOR DEVICES

[75] Inventor: Seiichi Iwamatsu, Tokyo, Japan

[73] Assignee: Hitachi, Ltd., Japan

[22] Filed: July 25, 1973

[21] Appl. No.: 382,297

Related U.S. Application Data

[62] Division of Ser. No. 204,005, Dec. 2, 1971, abandoned.

[30] Foreign Application Priority Data

Dec. 2, 1970 Japan ..................... 45-105840

[52] U.S. Cl. ..................... 148/187; 357/42

[51] Int. Cl.² ..................... H01L 21/22

[58] Field of Search ..................... 148/187; 317/235

[56] References Cited

UNITED STATES PATENTS 3,576,478 4/1971 Watkins et al. ..................... 317/235

3,670,403 6/1972 Lawrence et al. ..................... 148/187 X 3,673,471 6/1972 Klein et al. ..................... 357/42

OTHER PUBLICATIONS

Faggin et al., "Silicon Gate Technology," Solid State Electronics Vol. 13, No. 8, Aug. 1970, pp. 1125–1131.

*Primary Examiner*—C. Lovell

*Assistant Examiner*—J. M. Davis

*Attorney, Agent, or Firm*—Craig & Antonelli

[57] ABSTRACT

A MOS type semiconductor device including a P-type semiconductor substrate and at least one N-type region is formed by forming an insulator film on the surface of the substrate, applying a silicon layer on the surface of the insulator film, diffusing a P-type impurity into the silicon layer, removing selected portions of the silicon layer and of the insulator film, and selectively diffusing an N-type impurity into the P-type semiconductor substrate by utilizing the remaining portions of the silicon layer and of the insulator film as a mask.

2 Claims, 15 Drawing Figures

METHOD OF MANUFACTURING MOS TYPE SEMICONDUCTOR DEVICES

This is a division of application Ser. No. 204,005 filed Dec. 2, 1971, now abandoned.

BACKGROUND OF THE INVENTION

This invention relates to a MOS (metal oxide semiconductor) type semiconductor device, and more particularly to a N-channel enhancement type semiconductor device, and a method of manufacturing the same.

As is well known in the art a MOS type semiconductor device comprises a semiconductor substrate, an insulator film formed on one surface of the substrate and metal electrodes applied on the insulator surface, and operates such that a channel is induced in or controlled on the surface of the substrate immediately beneath the insulator film by applying a voltage to the electrodes. Holes (in the case of P-type conductivity) and electrons (in the case of N-type conductivity) are formed in the channel as charge carriers, and those devices in which the channel conducts in the absence of the voltage impressed upon the electrodes are termed depletion type, whereas those in which the channel is created only when the voltage is impressed upon the electrodes are termed enhancement type.

In a semiconductor device having an insulator film such as an oxide film (for example, an $SiO_2$ film) or a nitride film (for example, an $Si_3N_4$ film) formed on the surface of a semiconductor substrate, the phenomenon of inducing a minus charge (electrons) on the surface of the semiconductor substrate by the positive ions such as $Na^+$ or $Li^+$ prevailing in the insulator film is generally called the channel phenomenon. In the case of the N-type channel, the depletion type can be readily formed by this phenomenon. On the other hand, in the case of the P-type channel, it is difficult to form the channel unless a negative voltage exceeding a definite value, or a threshold voltage $V_t$ is impressed across the insulator film, so that the enhancement type can be more readily formed.

When the N-type channel is compared with the P-type channel, as the mobility of electrons is about twice as large as that of holes, the speed of the carriers of the N-type channel is increased correspondingly, which is especially advantageous for semiconductor devices for use at high frequencies.

However, N-type channel elements are not ordinarily used in MOSIC devices. Because, as above described, in the case of the N-type channels, most of them are formed as depletion type, when the integrated circuit is fabricated with such channel elements, adjacent elements form a parastic MOS element.

SUMMARY OF THE INVENTION

It is an object of this invention to provide an improved N-channel enhancement type MOS semiconductor device.

A further object of this invention is to provide a novel method of manufacturing an N-channel enhancement MOS semiconductor device.

Still another object of this invention is to provide a novel complementary MOS type semiconductor device and a method of manufacturing the same.

According to one aspect of this invention, there is provided a MOS type semiconductor device comprising a P-type semiconductor substrate, an N-type source region and an N-type drain region which are formed at closely adjacent selected portions in the semiconductor substrate, an insulator film formed on the surface of the semiconductor substrate at least between the source and drain regions, and a P-type semiconductor layer overlying the insulator film.

According to another aspect of the invention there is provided a complementary MOS type semiconductor device comprising an N-type semiconductor substrate, a P-type region formed in a selected portion of the substrate, a pair of spaced apart N-type regions formed in the P-type region, a pair of spaced apart P-type regions formed in another selected portion of the substrate, an insulator film formed on the surface of the semiconductor substrate at least between the pair of N-type regions and between the pair of N-type regions, and a polycrystalline silicon layer overlying the insulator film.

According to still another aspect of the invention there is provided a method of manufacturing an MOS type semiconductor device comprising the steps of preparing a P-type semiconductor substrate, forming an insulator film on the surface of the substrate, applying a silicon layer on the surface of the insulator film, diffusing a P-type impurity into the silicon layer, removing selected portions of the silicon layer and of the insulator film, and selectively diffusing an N-type impurity into the P-type semiconductor substrate by utilizing the remaining portions of the silicon layer and of the insulator film as a mask.

According to a further aspect of the invention, there is provided a method of manufacturing a complementary MOS type semiconductor device comprising the steps of preparing an N-type semiconductor substrate, forming a P-type region at a selected portion of the substrate, applying an insulator film to cover the P-type region and the substrate, forming a layer of polycrystalline silicon on the insulator film, removing portions of the polycrystalline silicon layer and of the insulator film to form a first pair of windows above the P-type region and a second pair of windows at another selected portion of the substrate, diffusing a P-type impurity into the N-type substrate through the second pair of windows to form a pair of source and drain regions and diffusing an N-type impurity into the P-type region through the first pair of windows to form a pair of N-type regions.

DESCRIPTION OF THE PREFERRED EMBODIMENTS

Figure 1:
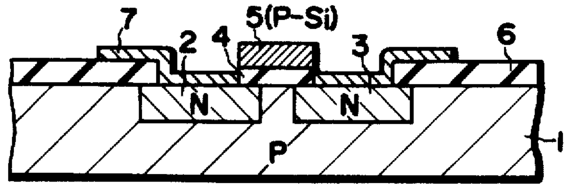
FIG. 1 is a longitudinal cross sectional view of a semiconductor device embodying the invention.

A preferred embodiment of the invention shown in FIG. 1 comprises a P-type silicon substrate 1, an N-type source region 2 and an N-type drain region 3 which are formed in the surface of the substrate at relatively close selected positions, and an $SiO_2$ film 4 overlying the surface portion of the P-type silicon substrate 1 between source region 2 and drain region 3. The thickness of the $SiO_2$ film 4 is from about 1,000 to about 1,500 A, preferably 1,000A.

The $SiO_2$ film 4 acts as a gate insulator film of a MOS type transistor. A P-type silicon layer 5 is formed on the gate insulator film, or the $SiO_2$ film 4.

Although not shown in the drawing, another insulator film, for example, a film of $Si_3N_4$ may be interposed between the $SiO_2$ layer 4 and the P-type silicon layer 5.

Another $SiO_2$ film 6 is provided on the surface of the P-type silicon substrate 1. Film 6 has a thickness of from about 6,000 to about 10,000A. In this example, it is assumed that film 6 has a thickness of 10,000A. There are also provided a source electrode 7 and a drain electrode 8 respectively connected to source region 2 and drain region 3.

Various steps of manufacturing the semiconductor device shown in FIG. 1 will now be described with reference to FIGS. 2A through 2F.

Figure 2A:
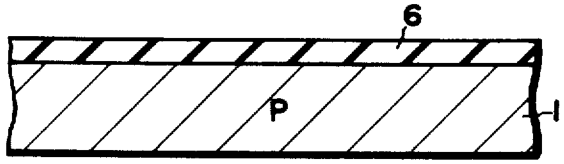
FIGS. 2A through 2G are longitudinal cross sectional views illustrating various steps of manufacturing a semiconductor device in accordance with the method of this invention.

A. A P-type silicon substrate 1 is prepared and the substrate is heat-treated in an oxydizing atmosphere at a temperature of 1,200°C for about 1 to 2 hours to form the $SiO_2$ film 6 on the surface of the substrate having a thickness of about 6,000 to about 10,000A (FIG. 2A).

Figure 2B:
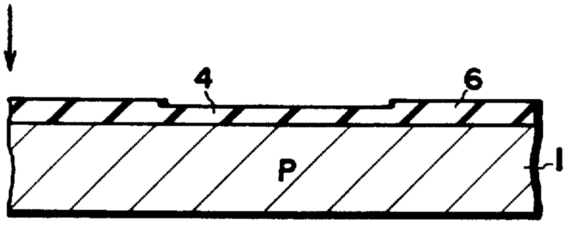

B. The thickness of a portion 4 of the $SiO_2$ film 6 is reduced to about 1,000 to 1,500A by conventional photoetching techniques. Alternatively the $SiO_2$ film at portion 4 may be removed entirely by photoetching and then oxidized again to reform a new $SiO_2$ film having the desired thickness. (FIG. 2B).

Figure 2C:
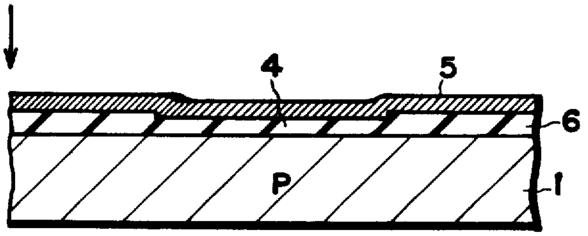
Figure 2D:
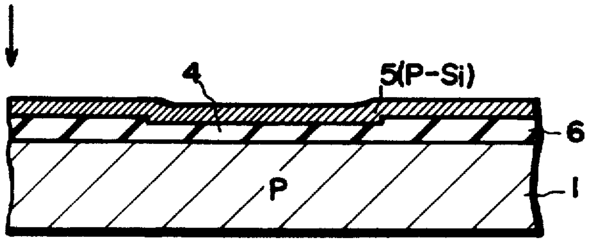

C. A silicon layer 5 is formed to a thickness of about 7,000A on the surface of substrate 1 by epitaxial, sputtering or vapor deposition process. (FIG. 2C). In this case, the silicon layer 5 will have a polycrystalline structure because it is formed on the $SiO_2$ film 6 acting as an insulator film.

D. A P-type impurity, for example, boron is diffused into the silicon layer 5 (FIG. 2C). Since the silicon layer 5 is thin and polycrystalline, a large quantity of boron is diffused over the entire surface, thus exhibiting $P^+$ type.

Figures 2E, 2F, 2G:
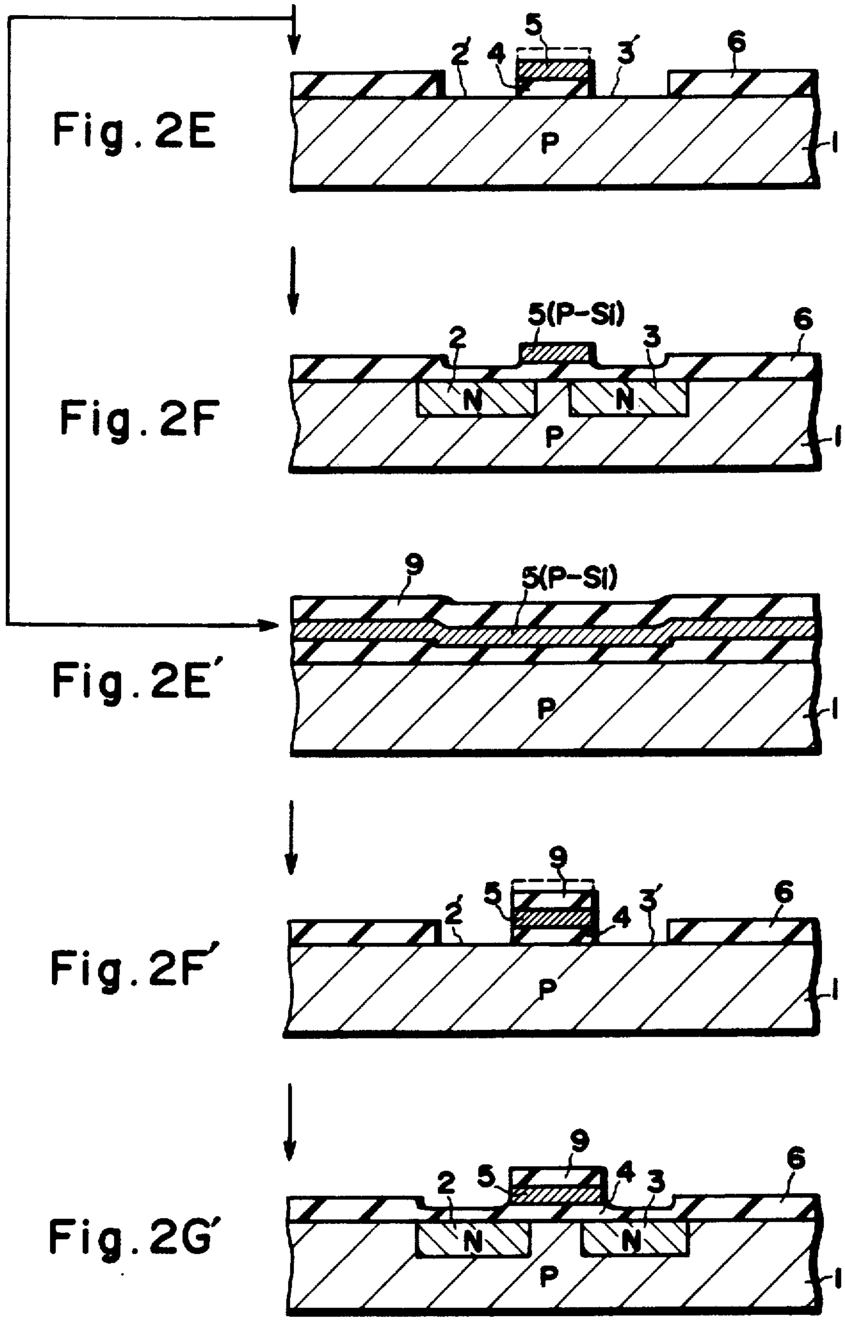

E. The portions of the $SiO_2$ film 4 and $P^+$-type silicon layer 5 which are used to form a gate region are covered by a mask of conventional anti-corrosive material (shown by dotted lines) and the unmasked portions are removed by etching to form windows 2' and 3' (FIG. 2E).

To this end, substrate 1 is first dipped into a mixed etchant of hydrofluoric acid and nitric acid, thus removing unwanted portions of the $P^+$-type silicon layer 5 and then in hydrofluoric acid, for example, for removing unwanted portions of the $SiO_2$ film 4. Although, the $SiO_2$ film 6 is etched more or less by the above described process step, since the $SiO_2$ film 6 has a thickness greater than that of the film portion 4, such slight etching thereof does not cause any trouble.

F. An N-type impurity, for example phosphorus is selectively diffused through windows 2' and 3' into the substrate to a thickness of about 0.5 to 1 micron to form N-type source region 2 and N-type drain region 3 by utilizing the remaining portions of the $P^+$-type silicon layer 5 and of the $SiO_2$ film 6 as a mask. Concurrently with or after this treatment, $SiO_2$ films are reformed in windows 2' and 3' (FIG. 2F).

After the step D, alternative steps E', F' and G' may be used as shown by an arrow in a manner to be described hereinafter.

E'. An $SiO_2$ film 9 is deposited on the $P^+$-type silicon layer 5, for example, by the pyrolysis of a silane (FIG. 2E'). For example, monosilane ($SiH_4$) is pyrolyzed at a temperature of about 400°C to form an $SiO_2$ film 9 having a thickness of about 5,000A. The purpose of this $SiO_2$ film 9 is to prevent diffusion of the impurity into the $P^+$ silicon layer 5 during the subsequent diffusion treatment.

F'. Portions of the $SiO_2$ films 4 and 9 and of the $P^+$-type silicon layer 5 which are to be used to form a gate region are masked by a corrosion-proof material as shown by dotted lines and the remaining portions are removed by etching to form windows 2' and 3'. (FIG. 2F'). Alternatively, at first the $SiO_2$ film 9 may be removed with hydrofluoric acid, then the $P^+$-type silicon layer with a mixture of hydrofluoric acid and nitric acid and finally the $SiO_2$ film 4 with hydrofluoric acid.

G'. An N-type impurity, for example, phosphorous is selectively diffused through windows 2' and 3' utilizing the remaining portions of the $SiO_2$ films 9 and 6 as the mask to form the N-type source region 2 and N-type drain region 8. Due to the presence of the $SiO_2$ film 9, the phosphorous does not diffuse into $P^+$-type silicon layer 5.

Concurrently with or subsequent to this treatment, $SiO_2$ films are reformed in windows 2' and 3'.

Then electrodes are applied to source region 2 and drain region 3 to obtain a semiconductor device (MOS type transistor) as shown in FIG. 1.

Figure 3:
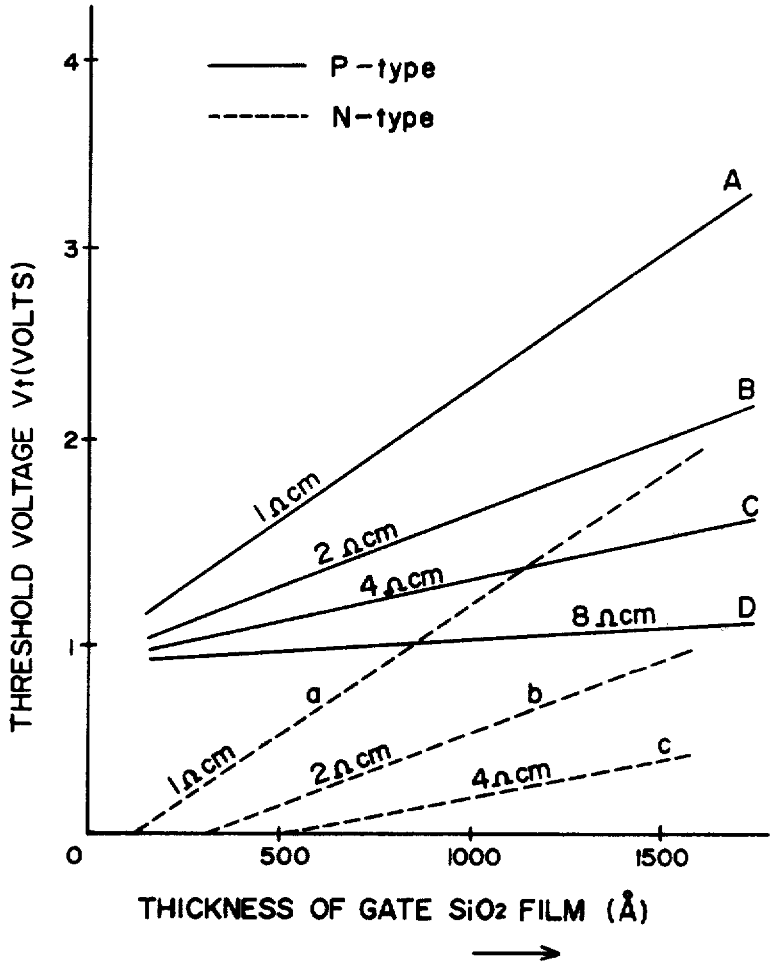
FIG. 3 is a graph showing various characteristics of the semiconductor devices, wherein the solid lines show the characteristics of a P-type device and the dotted lines those of an N-type device.

FIG. 3 shows the dependency of the threshold voltage $V_t$ of the MOS type transistor shown in FIG. 1 upon the thickness of the gate $SiO_2$ film by utilizing the specific resistance of the P-type silicon substrate 1 as a parameter. In this figure, solid line curves A, B, C and D represent the characteristics wherein the gate silicon layer 5 is converted into P-type, that is the characteristics of the novel semiconductor device. On the other hand, dotted line curves *a*, *b*, and *c* show the characteristics of the semiconductor device wherein the gate silicon layer 5 is converted into N-type. These characteristic curves are plotted for different values of the specific resistance of the substrate.

As can be noted from FIG. 3, enhancement type semiconductor devices can be obtained by the present invention not only of the P-type but also of the N-type. In the case of N-type, however, there exits the inconvenience that the range of selection of the specific resistance of the substrate is limited. More particularly, in the case of N-type, in order to limit the threshold voltage $V_t$ to 1 to 2 volts for producing an enhancement type semiconductor device, it is necessary to select the specific resistance of the substrate to be of low values. However, such decrease in the specific resistance of the substrate, or increase in the impurity concentration tends to decrease the mobility of charge carriers in the channel. On the other hand, in the case of P-type, where the threshold voltage is set between 1 and 2 volts, it is possible to broaden the range of the selection of the specific resistance of the substrate. Furthermore, since it is possible to use a substrate having a relatively high specific resistance it is possible to obtain a semiconductor device having a high breakdown voltage without decreasing the mobility of the charge carriers.

Figure 4:
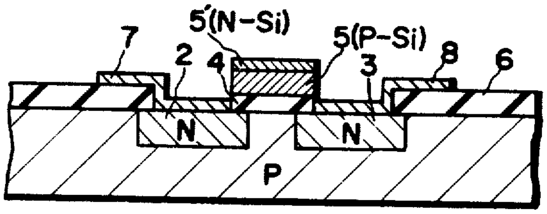
FIG. 4 is a longitudinal cross sectional view of a modified embodiment of this invention.

Either one of the alternative process steps shown in FIG. 2 may be used, but it should be understood that it is not always necessary to convert into P-type the entire area of the gate silicon layer 5 and that it is sufficient to convert into P-type its surface portion in contact with the $SiO_2$ film 4. For example, when diffusing the N-type impurity in the step shown in FIG. 2F, it is not necessary to apply the mask onto gate silicon layer 4. Thus it is possible to form a layer 5' diffused with an N-type impurity only on the surface portion of the gate silicon layer 4, as shown in FIG. 4. In this case, however, the initial thickness of the gate silicon layer 5 should be increased to assure the formation of the diffused layer 5'.

Although, the N-type diffused layers are also formed on the side surfaces of the gate silicon layer 2, since their thickness is only 0.5 micron, they do not cause any trouble.

Figure 5A:
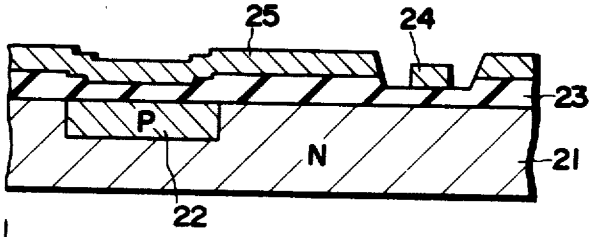
FIGS. 5A to 5C show various steps of manufacturing a complementary MOS type semiconductor device according to this invention.
Figure 5B:
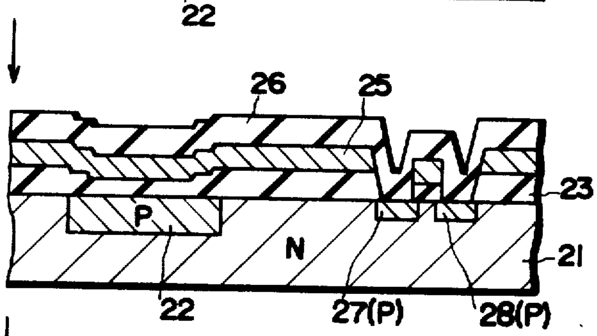
Figure 5C:
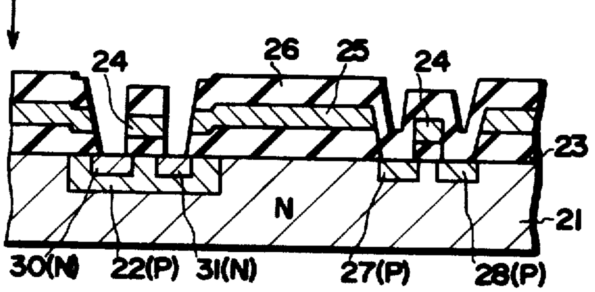

FIGS. 5A, 5B and 5C show various steps of manufacturing a complementary MOS type semiconductor device in accordance with this invention. In this example, an acceptor is selectively diffused into an N-type silicon semiconductor substrate 21 to form a P-type region 22. Then, a silicon oxide layer 23 is formed to cover the substrate 21 and then silicon is deposited to form a polycrystalline silicon layer 25. A portion of the polycrystalline silicon layer 25 is removed to leave a gate silicon layer 24. (FIG. 5A).

Portions of the silicon oxide layer 23 on both sides of the gate silicon layer 24 are removed, and a P-type impurity is diffused into the substrate at these removed portions to form a source region 27 and a drain region 28. Concurrently therewith, the polycrystalline silicon layers 24 and 25 are converted into P-type. Thereafter a silicon oxide layer 26 is formed by the method of CVD (Chemical Vapour Deposition) (FIG. 5B). Then N-type regions 30 and 31 are formed in P-type region 22 (FIG. 5C).

Thus, by the application of the invention to a complementary MOSFET, it is possible to provide a MOSFET with pairs of N-channels and P-channels having a stable threshold voltage of about 1 to 2 volts.

Thus, this invention provides an efficient N-channel enhancement type semiconductor device, thereby making it possible to manufacture a MOSIC efficiently, utilizing high mobility of electrons. Further, in accordance with this invention, with the adoption of the described semiconductor gate construction it is possible to use the self-registration system, thus assuring position-alignment of high accuracy. Furthermore, when the novel semiconductor device is combined with a P-channel enhancement type device, an efficient complementary semiconductor device can be obtained.

It should be understood that the invention is not limited to the particular embodiments illustrated and that any semiconductor type substrate of one conductivity type or of the opposite conductivity type may be used. Accordingly, terms "P-type" and "N-type" used in the specification are used only to describe specific examples, though these terms mean "one conductivity type" and "the opposite conductivity type," respectively, within the broader scope of this invention. Additionally, the present invention is applicable to any semiconductor device as known in the art particularly with respect to the semiconductor material and the material of the insulating films. Consequently, I do not wish to be limited to the details shown and described herein but intend to cover all such changes and modifications as are encompassed by the scope of the appended claims.

What is claimed is:

1. A method of manufacturing a complementary MOS type semiconductor device comprising the steps of preparing an N-type semiconductor substrate, forming a P-type region at a selected portion of said substrate, applying an insulator film to cover said P-type region and said substrate, forming a layer of polycrystalline silicon on said insulator film, removing portions of said polycrystalline silicon layer and of said insulator film to form a first pair of windows above said P-type region and a second pair of windows at another selected portion of said substrate, diffusing a P-type impurity into said N-type substrate through said second pair of windows to form a pair of source and drain regions and diffusing an N-type impurity into said P-type region through said first pair of windows to form a pair of N-type regions.

2. A method of manufacturing a complementary MOS type semiconductor device, comprising the steps of preparing a semiconductor substrate of a first conductivity type, forming a region of second conductivity type opposite to said first conductivity type at a selected portion of said substrate, applying an insulator film to cover said region and said substrate, forming a layer of polycrystalline silicon on said insulator film, removing portions of said polycrystalline silicon layer and of said insulator film to form a first pair of windows above said region and a second pair of windows at another selected portion of said substrate, diffusing an impurity of said second conductivity type into said substrate through said second pair of windows to form a pair of source and drain regions and diffusing an impurity of said first conductivity type into said region of said second conductivity type through said first pair of windows to form a pair of regions of said first conductivity type.

* * * * *